(12) United States Patent
Downey et al.

(10) Patent No.: US 6,921,979 B2
(45) Date of Patent: Jul. 26, 2005

(54) SEMICONDUCTOR DEVICE HAVING A BOND PAD AND METHOD THEREFOR

(75) Inventors: Susan H. Downey, Austin, TX (US); Peter R. Harper, Round Rock, TX (US); Kevin Hess, Austin, TX (US); Michael V. Leoni, Austin, TX (US); Tu-Anh Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/304,416

(22) Filed: Nov. 26, 2002

(65) Prior Publication Data

US 2003/0173668 A1 Sep. 18, 2003

Related U.S. Application Data

(63) Continuation-in-part of application No. 10/097,036, filed on Mar. 13, 2002.

(51) Int. Cl.[7] .......................... H01L 23/48; H01L 23/52; H01L 29/40
(52) U.S. Cl. ....................... 257/773; 257/779; 257/780; 257/781; 257/784; 257/786
(58) Field of Search ......................... 257/773, 779–781, 257/784, 786

(56) References Cited

U.S. PATENT DOCUMENTS

| | | | |
|---|---|---|---|
| 5,506,499 A | 4/1996 | Puar | |
| 5,514,892 A | 5/1996 | Countryman et al. | |
| 5,554,940 A | 9/1996 | Hubacher | |
| 5,783,868 A | 7/1998 | Galloway | |
| 5,886,393 A | * 3/1999 | Merrill et al. | ............... 257/531 |
| 6,144,100 A | 11/2000 | Shen et al. | |
| 6,153,448 A | 11/2000 | Takahashi et al. | |
| 6,229,221 B1 | 5/2001 | Kloen et al. | |
| 6,232,662 B1 | 5/2001 | Saran | |
| 6,303,459 B1 | 10/2001 | Chen | |
| 2001/0001541 A1 | 5/2001 | Bell | |
| 2002/0047213 A1 | 4/2002 | Komiyama et al. | |

FOREIGN PATENT DOCUMENTS

WO  WO 03/079437  9/2003

OTHER PUBLICATIONS

US 5,828,072, 10/1998, Li et al. (withdrawn)
Mukai, K. et al.; "A New Integration Technology That Enables Forming Bonding Pads on Active Areas"; International Electron Devices Meeting; Dec. 7–9, 1981; pp 62–65; IEEE.
Heinen, Gail et al.; "Wire bonds Over Active Circuits"; Proceedings of the Electronic Components and Technology Conference; May 1–4, 1994; pp 922–928; IEEE.
T. Schiml, "A 0.13 µm CMOS Platform with Cu/Low-k Interconnects for System On Chip Applications," *IEEE, Symposium on VLSI Technology Digest of Technical Papers*, 2001, 2 pgs.

* cited by examiner

Primary Examiner—Thien F Tran
(74) Attorney, Agent, or Firm—Joanna G. Chiu; Susan C. Hill

(57) ABSTRACT

A bond pad (200) has a first wire bond region (202) and a second wire bond region (204). In one embodiment, the first wire bond region (202) extends over a passivation layer (18). In an alternate embodiment, a bond pad (300) has a probe region (302), a first wire bond region (304), and a second wire bond region (306). In one embodiment, the probe region (302) and the wire bond region (304) extend over a passivation layer (18). The bond pads may have any number of wire bond and probe regions and in any configuration. The ability for the bond pads to have multiple wire bond regions allows for multiple wire connections to a single bond pad, such as in multi-chip packages. The ability for the bond pads to extend over the passivation layer also allows for reduced integrated circuit die area.

33 Claims, 12 Drawing Sheets

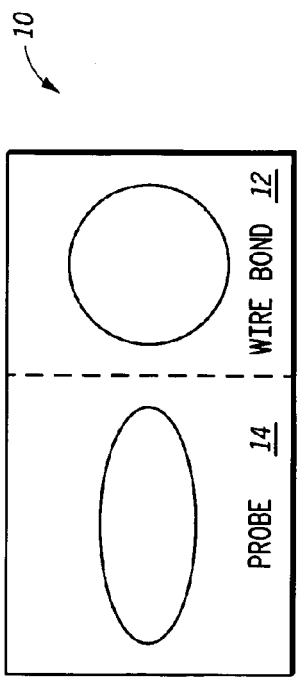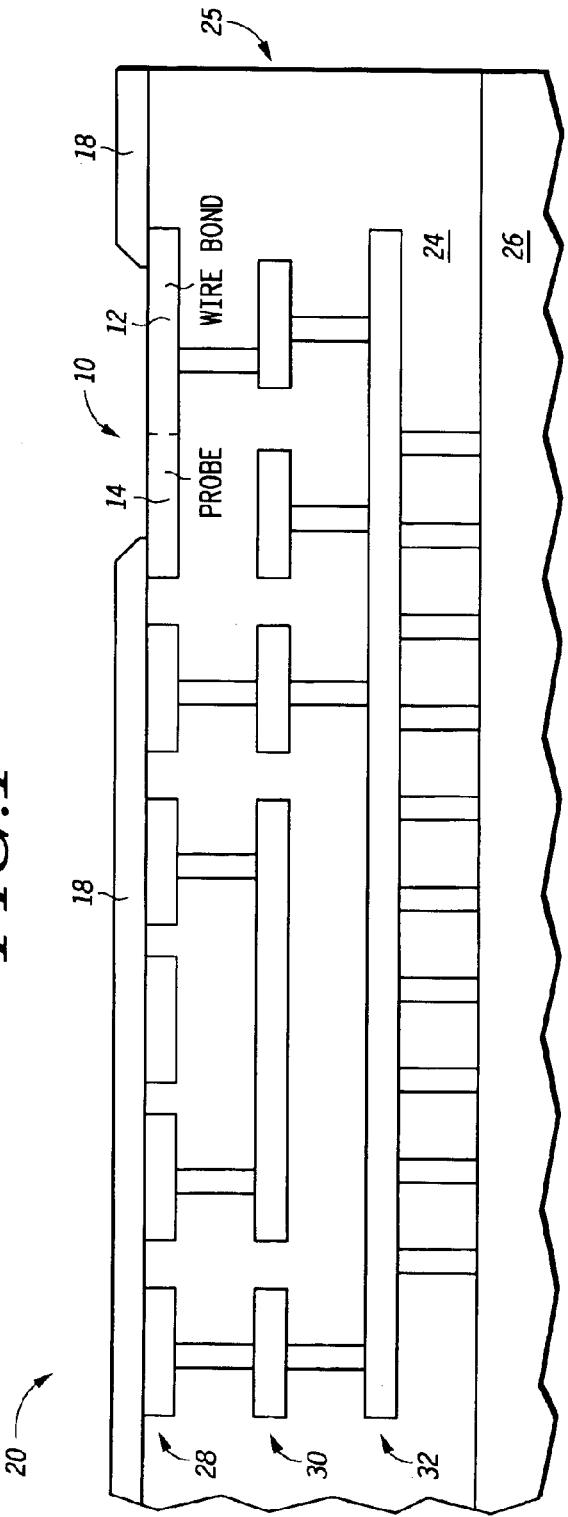

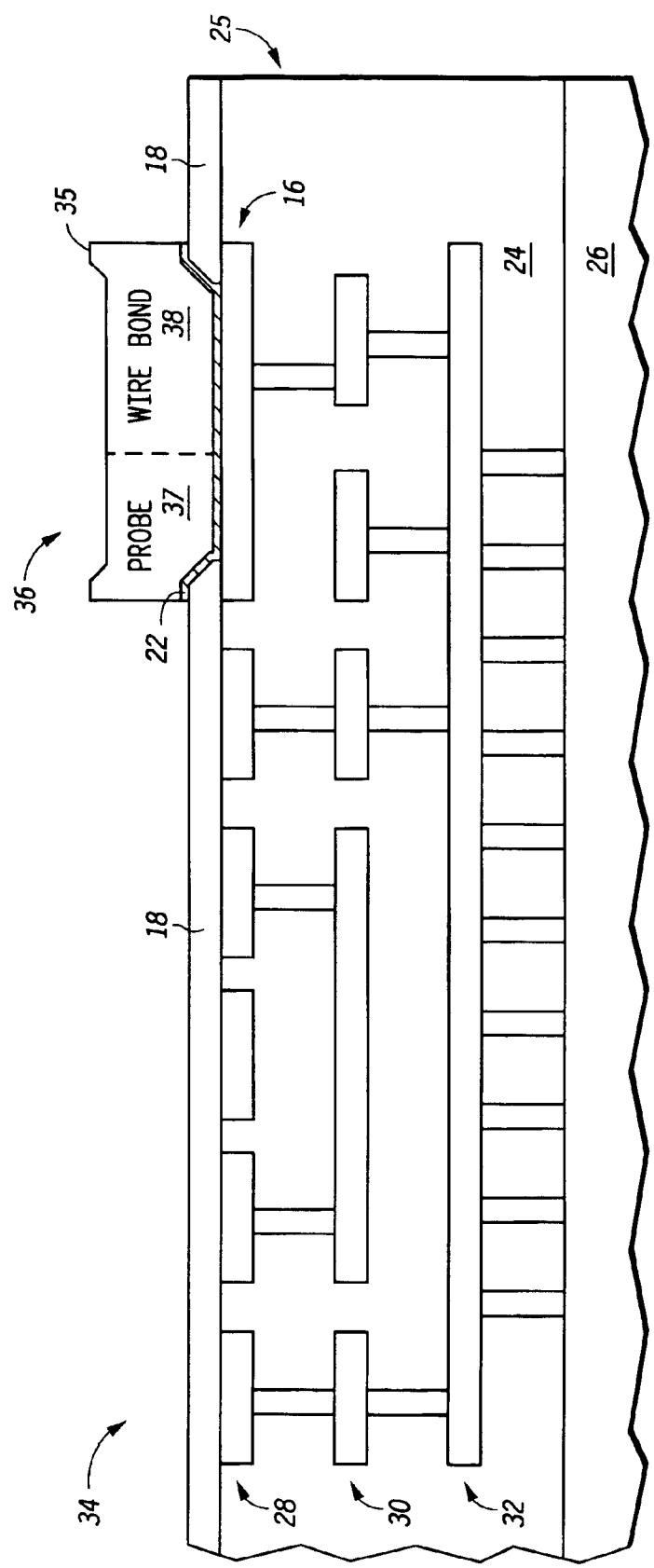

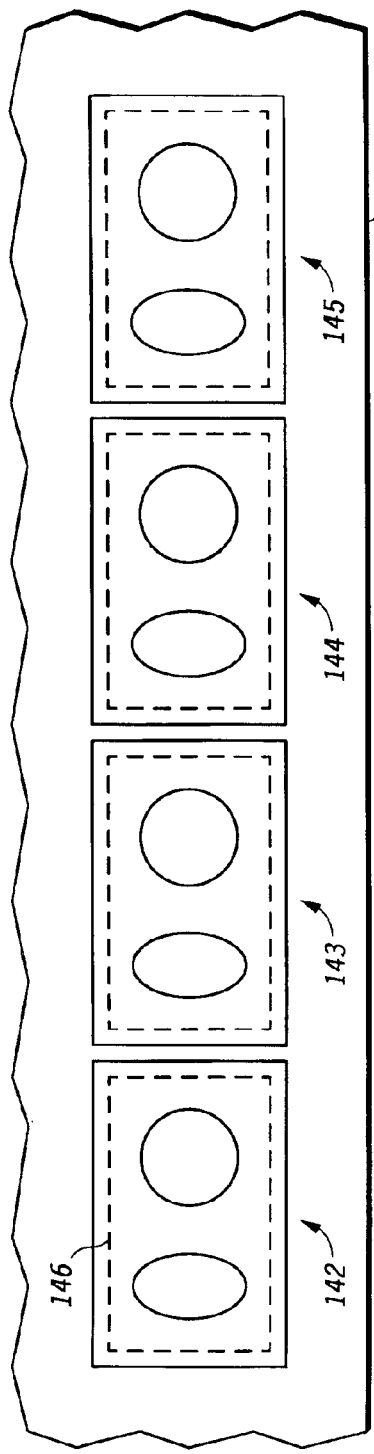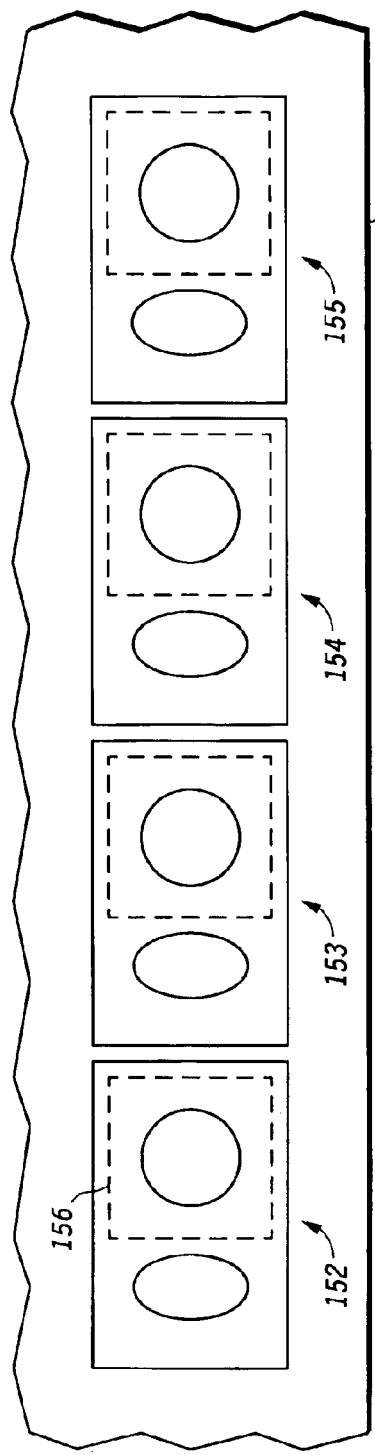

SEMICONDUCTOR DEVICE HAVING A BOND PAD AND METHOD THEREFOR

RELATED APPLICATION

This application is a continuation-in-part of U.S. application Ser. No. 10/097,036 filed Mar. 13, 2002, entitled "Semiconductor Device Having A Bond Pad And Method Therefor," and assigned to the assignee hereof.

This is related to copending U.S. application Ser. No. 10/097,059 filed Mar. 13, 2002, entitled, "Semiconductor Device Having a Wire Bond Pad and Method Therefor," and assigned to the assignee hereof.

FIELD OF THE INVENTION

The present invention relates generally to semiconductor devices, and more particularly, to a semiconductor device having bond pads.

BACKGROUND OF THE INVENTION

In integrated circuit manufacturing, wire bonding is a well proven method used to connect a semiconductor die having electrical circuitry to a pin on a component package. Also, in integrated circuit manufacturing, it is becoming increasingly common to package multiple semiconductor die in a single package, where the multiple semiconductor die can be in a stacked configuration. Within integrated circuit manufacturing it is also a common practice to test the functionality of the semiconductor die before completing component assembly. "Probe test" is one such method used to test a semiconductor where a probe contact is commonly used as a mechanical and electrical interface to bond pads on the die.

One problem with using a mechanical interface, for example, a probe needle, is that the bond pads may be damaged or contaminated, preventing a reliable electrical connection between the bond pad and the package pin when the die is wire bonded. This problem is made worse by the decreasing bond pad geometries characteristic of modern deep sub-micron semiconductor technology. Decreasing bond pad geometries include smaller bond pads on which smaller wire bonds are formed. This increases quality and reliability concerns for bond pads that have been damaged by a probe contact. As the bond pad size decreases, the ratio of the damage caused by a probe contact to the bond pad area increases. Another problem with the shrinking bond pad geometries is that the spacing between the bond pads can be too small for robust probe testing using traditional methods such as cantilever probe needles.

Thus, there is a need for the ability to probe test a die without causing unreliable wire bond connections, and to ensure a robust probe test on die with small bond pads and fine pitch spacing of the bond pads. There is also a need for the ability to provide electrical connections to multiple die within a single package. And in many cases, there is a need to meet the preceding criteria without affecting die size significantly to keep costs down.

BRIEF DESCRIPTION OF THE DRAWINGS

FIG. 1 illustrates a top down view of a wire bond pad in accordance with the present invention.

FIG. 2 illustrates a cross-sectional view of a semiconductor device having the wire bond pad of FIG. 1 in accordance with the present invention.

FIG. 3 illustrates a cross-sectional view of a semiconductor device in accordance with another embodiment of the present invention.

FIGS. 5 through 14 illustrate top down views of alternative embodiments of an integrated circuit having a plurality of wire bond pads in accordance with the present invention;

DETAILED DESCRIPTION

Generally, the present invention provides an integrated circuit having a plurality of bond pads. Each of the plurality of bond pads has a probe region and a wire bond region that are substantially non-overlapping and contiguous. In one embodiment, a bond pad extends over active circuitry and/or electrical interconnect layers of the integrated circuit. A portion of, or all, of the bond pad extends over the interconnect layers and a portion of the pad may be formed over a passivation layer and connected to a final metal layer pad. In one embodiment, the bond pad is formed from aluminum and the final metal layer pad is formed from copper.

Separating the probe region from the wire bond region and forming the bond pad over active circuitry has several advantages. In an application requiring very fine pitch between the bond pads, the probe regions and wire bond regions may be staggered to effectively increase the distance between probe regions. By separating the probe region from the wire bond region, the wire bond region is not damaged by probe testing, allowing for more reliable wire bonds. Also, forming the bond pad over active circuitry, including metal interconnect layers, allows the integrated circuit to be smaller.

In an alternate embodiment of the present invention, each of the plurality of bond pads has a first wire bond region and a second wire bond region that are substantially non-overlapping and contiguous. In one embodiment, the bond pads extend over active circuitry and/or electrical interconnect layers of the integrated circuit. A portion of, or all, of the bond pad extends over the interconnect layers and a portion of the pad may be formed over a passivation layer and connected to a final metal layer pad. In one embodiment, the bond pad may also include a probe region in addition to the first and second wire bond regions.

The ability to provide for multiple wire bond regions in each bond pad allows for multiple wire bond connections to each bond pad. This allows for more efficient wire bond connections between integrated circuit die, whether they are in a stacked configuration or adjacent to each other. Also, by separating the probe region from the multiple wire bond region, the wire bond regions are not damaged by probe testing, allowing for more reliable wire bonds. Also, as mentioned above, forming the bond pad over active circuitry, including metal interconnect layers, allows the integrated circuit to be smaller.

FIG. 1 illustrates a top down view of a bond pad 10 in accordance with the present invention. Bond pad 10 is separated into a wire bond region 12 and a probe region 14 as indicated by the dashed line. Wire bond region 12 and probe region 14 are laid out and sized as needed to accommodate the size and accuracy of the wire bonding and probing tools. In the illustrated embodiment, wire bond region 12 is shown smaller than probe region 14. In other embodiments, the regions may be sized differently.

Figure 4:
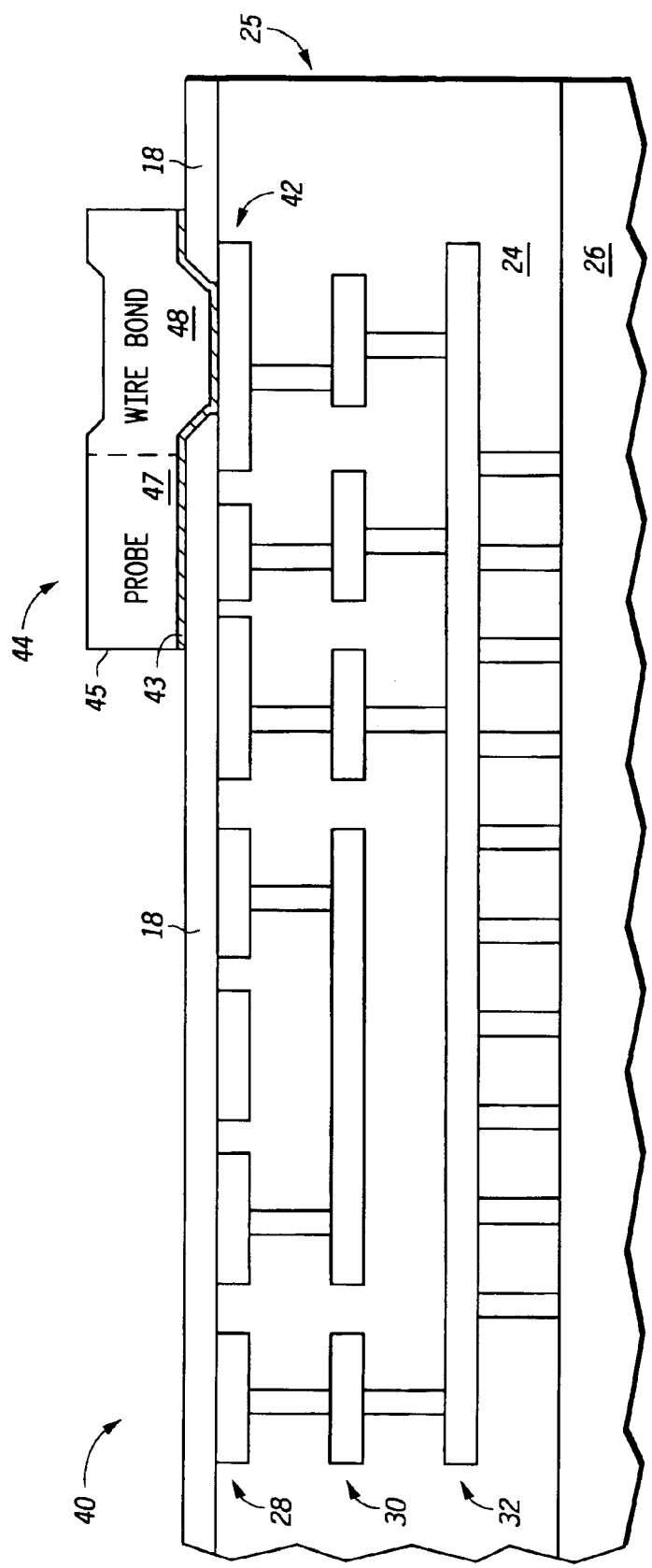
FIG. 4 illustrates a cross-sectional view of a semiconductor device in accordance with another embodiment of the present invention.

Bond pad 10 can be designed in different semiconductor devices with cross-sectional views illustrated in FIG. 2, FIG. 3, and FIG. 4. Note that like or similar elements are given the same reference number throughout the figures. Also note the figures are not drawn to scale. FIG. 2 illustrates a cross-sectional view of a semiconductor device 20 in accordance with the present invention. Semiconductor device 20 has an edge, or perimeter 25, passivation layer 18, bond pad 10, interconnect region 24, and active region, or substrate 26. The bond pad 10 has wire bond region 12 and probe region 14 (see FIG. 1) and is positioned relative to perimeter 25. Interconnect region 24 includes metal layers 28, 30, and 32 for routing power, ground, signal, and other lines between various components of semiconductor device 20. As illustrated in FIG. 2, metal layer 28, hereinafter referred to as final metal layer 28 is positioned close to the surface of semiconductor device 20 also includes bond pad 10 where probe and wire bond are applied for making a connection to a device (not shown) located external to semiconductor device 20. The metal layers of interconnect region 24 may be interconnected between each other using vias. Interconnect metal layer 32 is electrically connected to active region 26 with contacts.

Semiconductor device 20 is subjected to conventional fabrication techniques for forming electrical circuits in active region 26, or substrate. The electrical circuits may be for various integrated circuit applications, such as for example, communications, transportation, general computation, or entertainment. In the illustrated embodiment, metal layers 28, 30, and 32 are formed in conductive materials, for example, aluminum, copper, or gold. In other embodiments, there may be more or less metal layers. Bond pad 10 is formed as part of final metal layer 28. After metal layer 28 is formed, passivation layer 18 is deposited over the surface of the semiconductor device. Openings are provided in passivation layer 18, such as shown over bond pad 10, to allow for electrical contacts, such as between semiconductor device 20 to a pin on a package.

Bond pad 10 is formed from a relatively thick layer of copper. In one embodiment, the copper may be 0.3 to 1.0 microns thick. Tests have shown that bond pad 10 is strong enough to withstand the impact of a wire bonding tool and can be formed over interconnect layer 24 without damage to interconnect layer 24 and any underlying circuits of active region 26 as illustrated in FIG. 2.

FIG. 3 illustrates a cross-sectional view of a semiconductor device 34 in accordance with the present invention. Semiconductor device 34 has an edge, or perimeter 25, passivation layer 18, interconnect region 24, active region 26, and a bond pad 36. Bond pad 36 includes final metal layer pad 16 and aluminum pad layer 35. Aluminum pad layer 35 includes wire bond region 38 and probe region 37. Aluminum pad layer 35 may be between about 0.5 to 2.0 microns thick. Bond pad 36 is positioned relative to the perimeter 25 of semiconductor device 34 and is separated from the final metal layer pad 16 by a barrier layer 22. Bond pad 36 is laid out and sized to accommodate probe region 37 and wire bond region 38.

Semiconductor device 34 is subjected to fabrication techniques and materials as described for semiconductor device 20 of FIG. 2. In addition, barrier layer 22 is formed over passivation layer 18 to provide a diffusion barrier and adhesion layer between final metal layer pad 16 and bond pad 36, and between bond pad 36 and passivation layer 18. After barrier layer 22 is deposited, aluminum pad layer 35 is deposited over barrier layer 22. Barrier layer 22 and aluminum pad layer 35 are then patterned to form the final shape and size required for probe and wire bond regions. In the illustrated embodiment, aluminum pad layer 35 is formed from aluminum, but in other embodiments, aluminum pad layer 35 may be formed from other electrically conductive materials. Also, metal layers 28, 30, and 32 of the interconnect region 24, and final metal layer pad 16 are formed from copper. In other embodiments, other conductive materials may be used for bond pad 36, final metal layer pad 16, and metal layers 28, 30, and 32. For example, metal layers 28, 30, and 32, and final metal layer pad 16 may be fabricated from aluminum, or gold, and final metal layer pad 16 may include gold. Also, barrier layer 22 is formed from tantalum in the illustrated embodiment. But in other embodiments barrier layer 22 may be any material for forming a diffusion barrier and adhesion layer between dissimilar and adjacent materials. Examples of diffusion and barrier materials are tantalum nitride, titanium, titanium nitride, nickel, tungsten, titanium tungsten alloy, and tantalum silicon nitride.

Aluminum layer pad 35 and final metal pad 16 of bond pad 36 are formed from relatively thick layers of aluminum and copper, respectively. Therefore, bond pad 36 is strong enough to withstand the impact of a wire bonding tool and can be formed over interconnect layer 24 without damage to interconnect layer 24 and any underlying circuits of active region 26 as illustrated in FIG. 3.

FIG. 4 illustrates a cross-sectional view of a semiconductor device 40 in accordance with another embodiment of the present invention. Semiconductor device 40 has an edge, or perimeter 25, passivation layer 18, interconnect region 24, active region 26, and bond pad 44. Bond pad 44 includes aluminum pad 45 and final metal pad 42. Final metal pad 42 is formed as a portion of final metal layer 28. Bond pad 44 is positioned relative to the perimeter 25 of semiconductor device 40 and is separated into a probe region and a wire bond region is illustrated in FIG. 4 by a vertical dashed line. Aluminum pad 45 is separated from the final metal layer pad 42 by a barrier layer 43.

Semiconductor device 40 is subjected to fabrication techniques and materials as described in FIG. 2 and FIG. 3. However, in the device of FIG. 4, one portion of the bond pad 44 extends over passivation layer 18 and underlying active circuitry 26 and/or interconnect region 24, and the remaining portion is connected to the final metal layer pad 42 at an opening in passivation layer 18. As described above, bond pad 44 is separated into a wire bond region and a probe region. The probe region is on the portion of bond pad 10 that extends onto passivation layer 18 and over the electrical interconnect layers 28, 30, and 32 of interconnect region 24.

The wire bond region is formed on the portion of bond pad 44 that is connected to the final metal layer pad 42. The wire bond region is strong enough to withstand the impact of a wire bonding tool without damage or deformation to the underlying circuits and may also be formed over the metal layers of interconnect region 24.

By extending the probe region over passivation layer 18, the size of final metal layer pad 42 is not affected, and the size of bond pad 44 can be increased without increasing the overall size of the semiconductor device. Also, because final metal layer pad 42 is not used for probe test or wire bonding, the size and shape of final metal layer pad 42, and the size and shape of opening in passivation layer 18, are only constrained by the area needed to provide an electrical connection to bond pad 44. In other embodiments, there may be a plurality of smaller final metal layer pads and corresponding passivation openings that together provide sufficient electrical connection to bond pad 44. Since bond pad 44 is extended over passivation layer 18 and the size of final metal layer pad 42 is not affected, there is more flexibility in laying out probe and wire bond regions. For an example, the probe region and wire bond region are not necessarily contiguous in other embodiments.

Bond pad 44 may be formed from aluminum and the final metal layer pad 42 may be formed from copper. In addition to separating the probe region from the wire bond region for more reliable wire bonds, probing over the passivation layer 18 eliminates the risk of inadvertently exposing the copper of the final metal layer pad 42. Exposed copper is readily oxidized and creates an unreliable surface for wire bonding.

Figure 5:
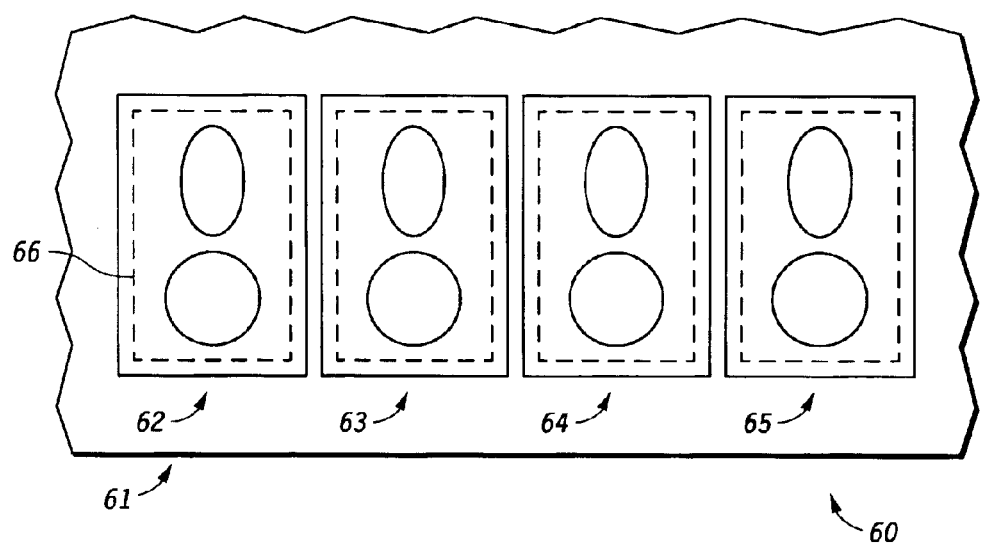

FIG. 5 illustrates a top down view of a semiconductor device 60 in accordance with one embodiment of the present invention. Integrated circuit 60 includes a plurality of bond pads similar to the bond pad illustrated in FIG. 1 and can be constructed in accordance with the embodiments illustrated in FIG. 2 or FIG. 3. Integrated circuit 60 includes a plurality of bond pads 62–65, formed along an edge 61 of the integrated circuit 60. The dashed line on each of the plurality of bond pads indicates an opening 66 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are arranged relative to perimeter 61. The wire bond regions are closer to perimeter 61 than the probe regions of each bond pad. The wire bond regions of adjacent bond pads are maintained in a line an equal distance from edge 61. Likewise, the probe regions of adjacent bond pads are maintained in a line an equal distance from edge 61. In other embodiments, probe regions and wire bond regions may be interchanged.

Figure 6:
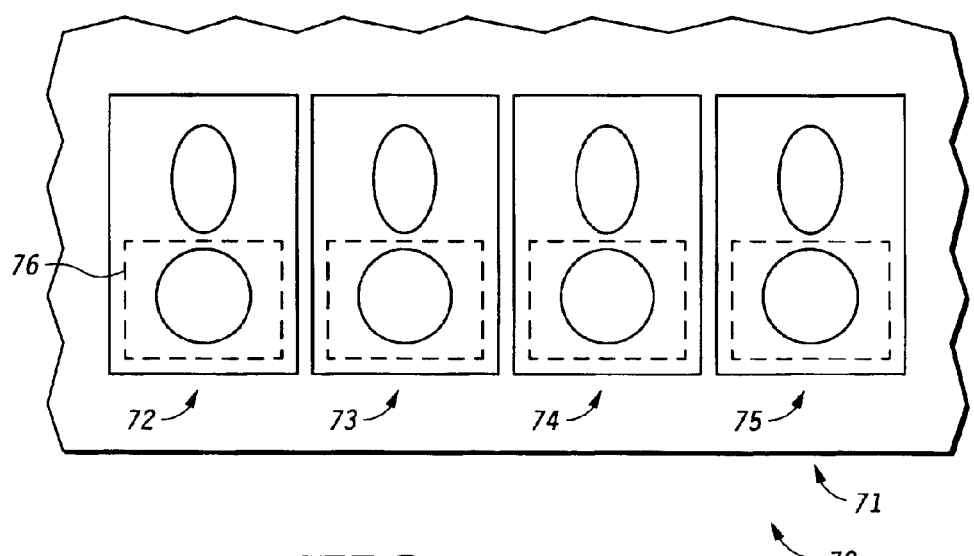

FIG. 6 illustrates a top down view of a semiconductor device 70 in accordance with another embodiment of the present invention. Integrated circuit 70 includes a plurality of bond pads similar to the bond pad illustrated in FIG. 1 and can be constructed in accordance with the embodiments illustrated in FIG. 4. Integrated circuit 70 includes a plurality of bond pads 72–75, formed along an edge 71 of the integrated circuit 70. The dashed line on each of the plurality of bond pads indicates an opening 76 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are arranged relative to perimeter 71. The wire bond regions are closer to perimeter 71 than the probe regions of each bond pad. The wire bond regions of adjacent bond pads are maintained in a line an equal distance from edge 71. Likewise, the probe regions of adjacent bond pads are maintained in a line an equal distance from edge 71. In other embodiments, probe regions and wire bond regions may be interchanged.

A portion of the bond pads 72–75 are formed over the passivation layer, and a portion of the bond pads are formed over the final metal layer pad as illustrated in FIG. 4.

Figure 7:
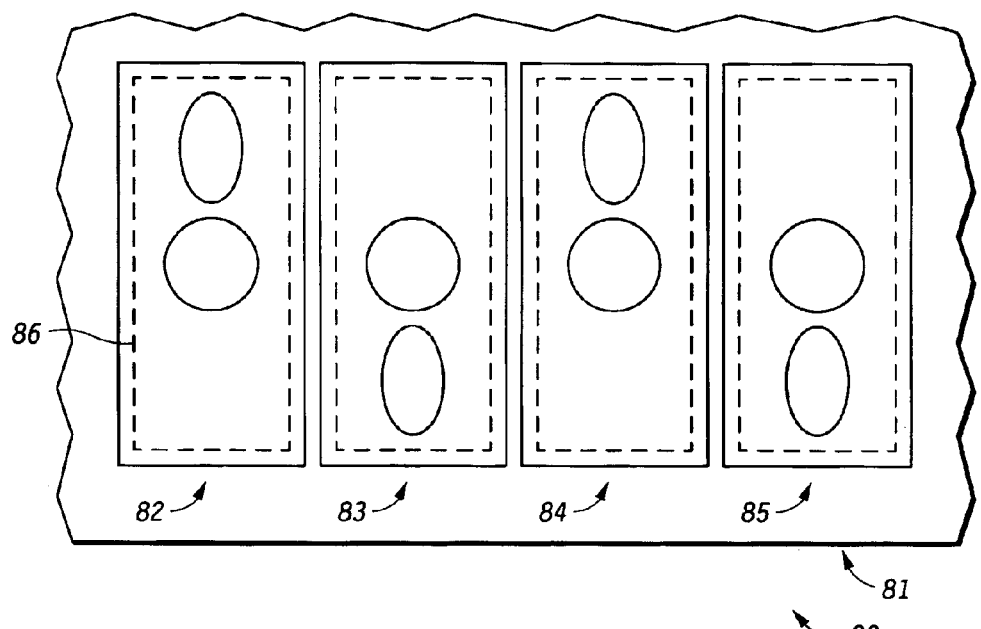

FIG. 7 illustrates a top down view of a semiconductor device 80 in accordance with another embodiment of the present invention. Integrated circuit 80 includes a plurality of bond pads similar to the bond pad illustrated in FIG. 1 and can be constructed in accordance with the embodiments illustrated in FIG. 2 or FIG. 3. Integrated circuit 80 includes a plurality of bond pads 82–85, formed along an edge 81 of the integrated circuit 80. The dashed line on each of the plurality of bond pads indicates an opening 86 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are generally the same size and are arranged generally an equal distance from perimeter 81.

The probe regions (indicated with an oval) are formed in a staggered, alternating manner on opposite sides of the wire bond regions (circles), while the wire bond regions are maintained in a line an equal distance from an edge 81 of integrated circuit 80. Also, the center of each bond pad is maintained in a line an equal distance from edge 81. Substantially all of the bond pads 82–85 are formed over the final metal layer pad, as illustrated in FIG. 3.

By staggering or alternating the probe regions, the distance between probe regions is increased, allowing for more robust probe testing of very fine pitch devices, and flexibility to use various probe technologies such as for example, cantilever and vertical probe technologies. The current probe technology cannot support a pad pitch below a specified minimum pitch, where pitch refers to a distance between the pads. By elongating the bond pads and staggering the probe regions, current probe technology can be extended to pads having smaller pitch. Maintaining the wire bond regions in a line may make programming of the wire bonding equipment simpler. Note that in other embodiments, the probe regions and the wire bond regions may be interchanged.

Figure 8:
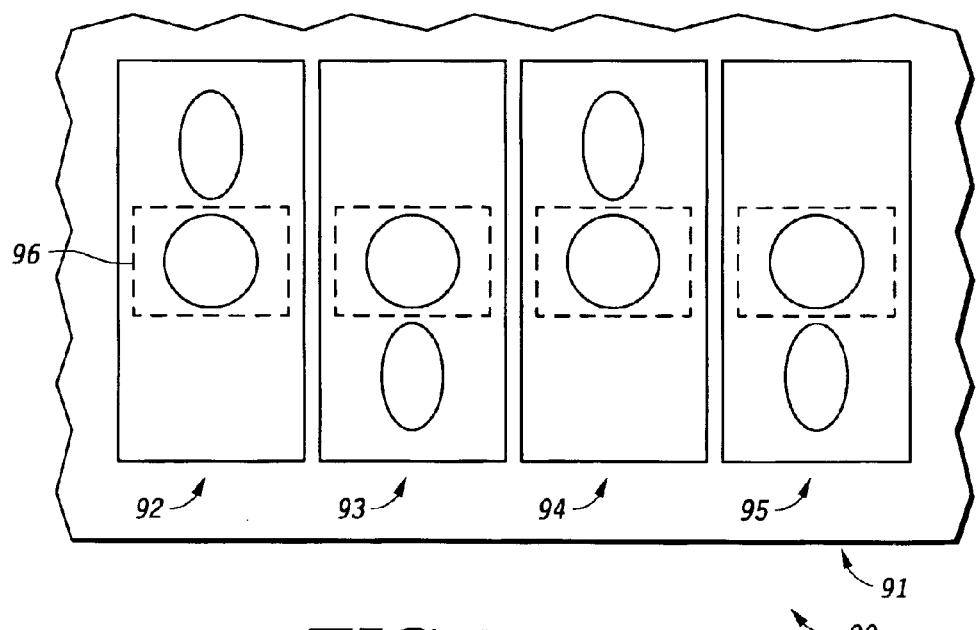

FIG. 8 illustrates a top down view of a semiconductor device 90 in accordance with another embodiment of the present invention. Integrated circuit 90 includes a plurality of bond pads similar to the bond pad illustrated in FIG. 1 and can be constructed in accordance with the embodiments illustrated in FIG. 4. Integrated circuit 90 includes a plurality of bond pads 92–95, formed along an edge 91 of the integrated circuit 90. The dashed line on each of the plurality of bond pads indicates an opening 96 formed in a passivation layer.

The bond pad arrangement of FIG. 8 is the same as the bond pad arrangement of FIG. 7 except that opening 96 in the passivation layer is smaller and only surrounds each of the wire bond regions indicated generally with a circle. The probe regions are indicated with an oval and are staggered as described above for FIG. 7. Also, the probe regions are extended over the passivation layer of semiconductor device 90.

Figure 9:
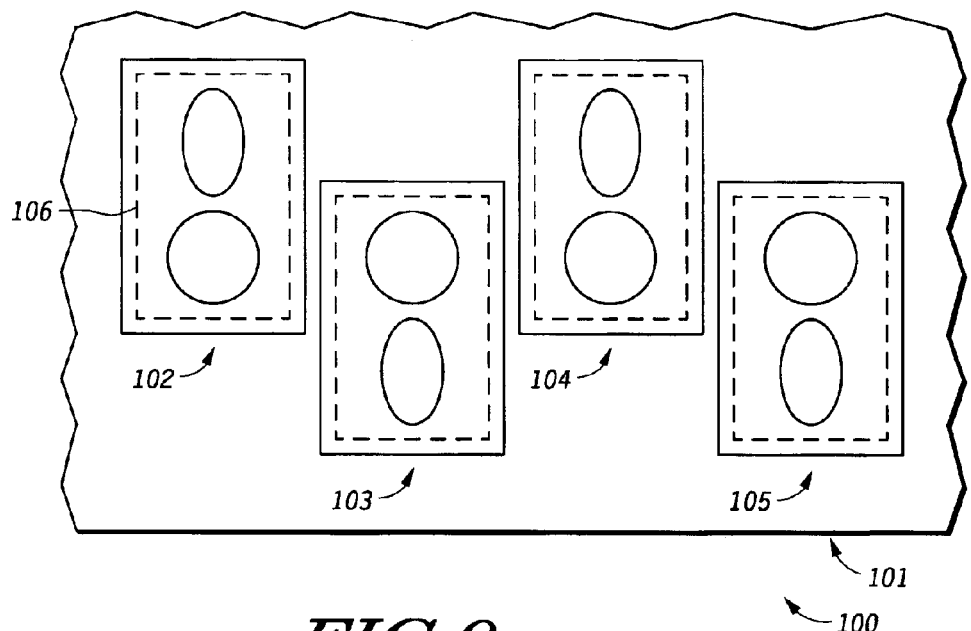

FIG. 9 illustrates a top down view of a semiconductor device 100 in accordance with another embodiment of the present invention. Integrated circuit 100 includes a plurality of bond pads similar to the bond pad illustrated in FIG. 1 and can be constructed in accordance with the embodiments illustrated in FIG. 2 or FIG. 3. Integrated circuit 100 includes a plurality of bond pads 102–105, formed along an edge 101 of the integrated circuit 100. The dashed line on each of the plurality of bond pads indicates an opening 106 formed in a passivation layer.

Opening 106 in the passivation layer surrounds the wire bond region (circle) and the probe region (oval) of each of the bond pads 102–105. The bond pads are arranged in a staggered manner, where bond pads 102 and 104 are located farther away from perimeter 101 than bond pads 103 and 105. Also, the probe regions of each of the bond pads are staggered as described above for FIG. 7 and FIG. 8. In addition, the wire bond region of each pad is arranged an equal distance from perimeter 101.

The bond pads of FIG. 9 are shorter than the bond pads of FIG. 8 because the area not used for probe test or wire bonding has been removed. The space provided by the removed portions of the bond pads may provide more surface area on the semiconductor device for more features or bond pads on the integrated circuit.

Figure 10:
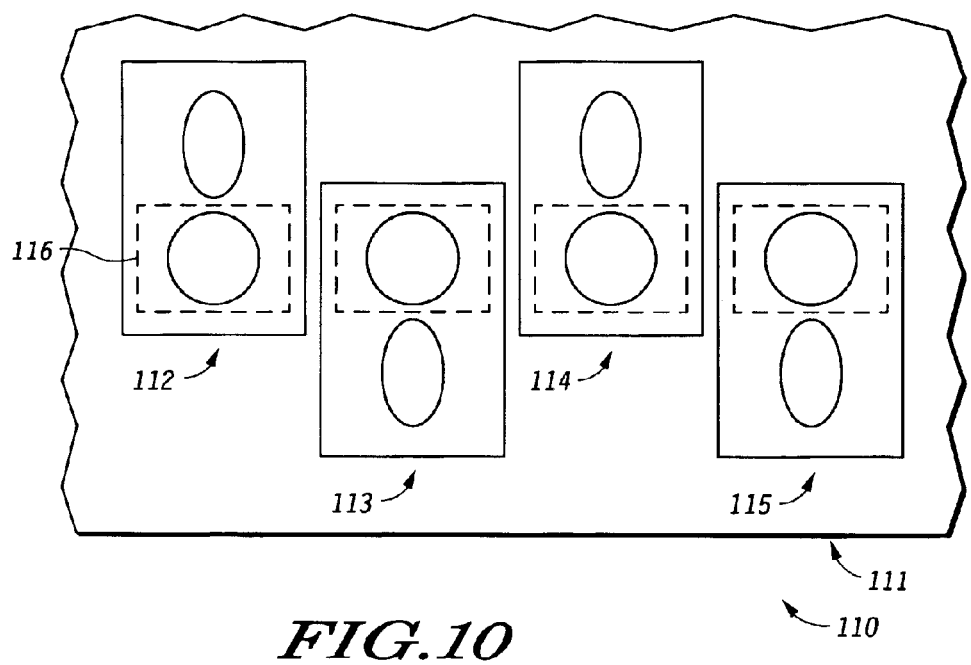

FIG. 10 illustrates a top down view of a semiconductor device 110 in accordance with another embodiment of the present invention. Integrated circuit 110 includes a plurality of bond pads similar to the bond pad illustrated in FIG. 1 and can be constructed in accordance with the embodiments illustrated in FIG. 4. Integrated circuit 110 includes a plurality of bond pads 112–115, formed along an edge 111 of the integrated circuit 110. The dashed line on each of the plurality of bond pads indicates an opening 116 formed in a passivation layer.

Bond pads 112–115 are arranged in a staggered manner, where bond pads 112 and 114 are located farther away from perimeter 111 than bond pads 113 and 115. Also, the probe regions of each of the bond pads are staggered as described above for FIG. 7, FIG. 8, and FIG. 9. In addition, the wire bond region of each pad is arranged an equal distance from perimeter 111.

Opening 116 in the passivation layer is smaller and only surrounds each of the wire bond regions indicated generally with a circle. The probe regions are extended over the passivation layer of semiconductor device 110.

Figure 11:
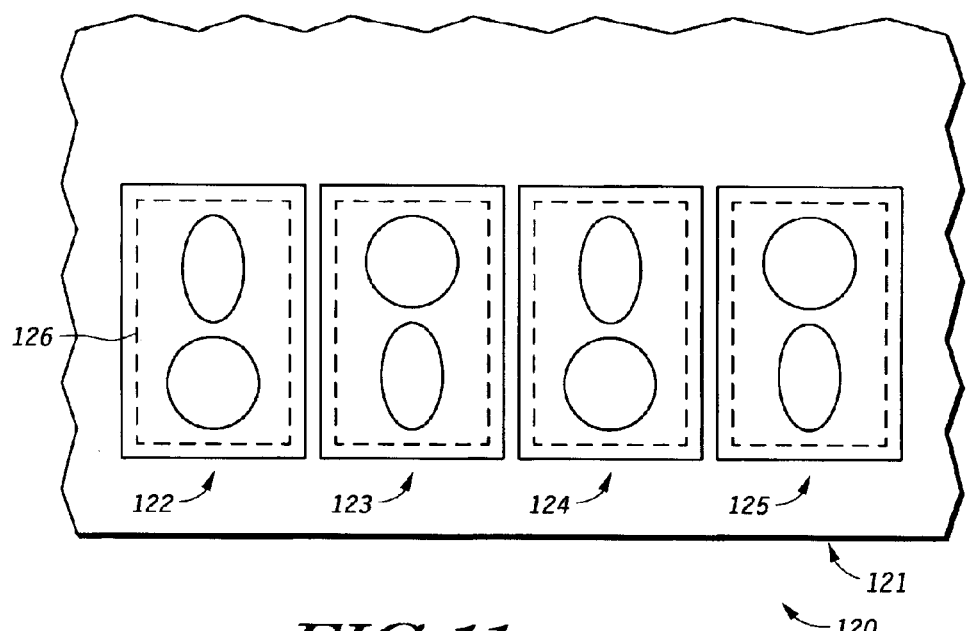

FIG. 11 illustrates a top down view of a semiconductor device 120 in accordance with another embodiment of the present invention. Integrated circuit 120 includes a plurality of bond pads similar to the bond pad illustrated in FIG. 1 and can be constructed in accordance with the embodiments illustrated in FIG. 2 or FIG. 3. Integrated circuit 120 includes a plurality of bond pads 122–125, formed along an edge 121 of the integrated circuit 120. The dashed line on each of the plurality of bond pads indicates an opening 126 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are arranged relative to perimeter 121. In the embodiment of FIG. 11, both the probe regions and the wire bond regions are staggered.

Figure 12:
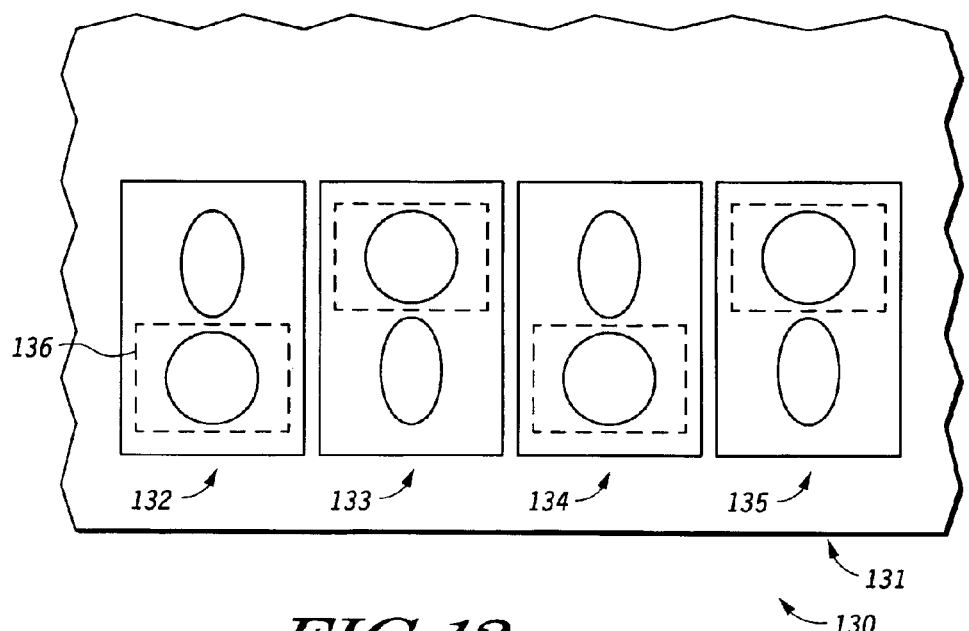

FIG. 12 illustrates a top down view of a semiconductor device 130 in accordance with another embodiment of the present invention. Integrated circuit 130 includes a plurality of bond pads similar to the bond pad illustrated in FIG. 1 and can be constructed in accordance with the embodiments illustrated in FIG. 4. Integrated circuit 130 includes a plurality of bond pads 132–135, formed along an edge 131 of the integrated circuit 130. The dashed line on each of the plurality of bond pads indicates an opening 136 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are arranged relative to perimeter 131. In the embodiment of FIG. 12, both the probe regions and the wire bond regions are staggered. Also, the probe regions are formed over the passivation layer.

FIG. 13 illustrates a top down view of a semiconductor device 140 in accordance with another embodiment of the present invention. Integrated circuit 140 includes a plurality of bond pads similar to the bond pad illustrated in FIG. 1 and can be constructed in accordance with the embodiments illustrated in FIG. 2 and FIG. 3. Integrated circuit 140 includes a plurality of bond pads 142–145, formed along an edge 141 of the integrated circuit 140. The dashed line on each of the plurality of bond pads indicates an opening 146 formed in a passivation layer. The area on each bond pad bounded by an oval is the area designated generally for probe testing and the area on each bond pad bounded by a circle is the area designated generally for wire bonding. The long axis of the bond pads are oriented parallel to the edge 141. The wire bond regions and probe regions of adjacent bond pads are maintained in a line an equal distance from edge 141. Because the long axis of the bond pads are oriented parallel to the edge 141 the overall height of the bond pads are reduced while maintaining separate wire bond regions and probe regions for integrated circuits that are not pad limited.

FIG. 14 illustrates a top down view of a semiconductor device 150 in accordance with another embodiment of the present invention. Integrated circuit 150 includes a plurality of bond pads similar to the bond pad illustrated in FIG. 1 and can be constructed in accordance with the embodiments illustrated in FIG. 4. Integrated circuit 150 includes a plurality of bond pads 152–155, formed along an edge 151 of the integrated circuit 150. The dashed line on each of the plurality of bond pads indicates an opening 156 formed in a passivation layer. The area on each bond pad bounded by an oval is the area designated generally for probe testing and the area on each bond pad bounded by a circle is the area designated generally for wire bonding. The long axis of the bond pads are oriented parallel to the edge 151. The wire bond regions and probe regions of adjacent bond pads are maintained in a line an equal distance from edge 151. Because the long axis of the bond pads are oriented parallel to the edge 151 the overall height of the bond pads are reduced while maintaining separate wire bond regions and probe regions for integrated circuits that are not pad limited. In FIG. 14, the probe regions are formed over the passivation layer.

Figure 15:
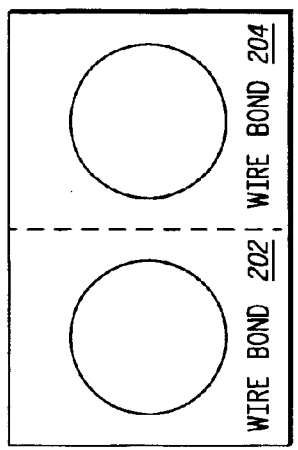
FIG. 15 illustrates a top down view of a wire bond pad in accordance with one embodiment of the present invention.

FIG. 15 illustrates a top down view of a bond pad 200 in accordance with an alternate embodiment of the present invention. Bond pad 200 is separated into a first wire bond region 202 and a second wire bond region 204 as indicated by the dashed line. Wire bond region 202 and wire bond region 204 are laid out and sized as needed to accommodate the size and accuracy of the wire bonding tools. In the illustrated embodiment, wire bond region 202 is shown as being the same size as wire bond region 204. In other embodiments, the regions may be sized differently.

Figure 16:
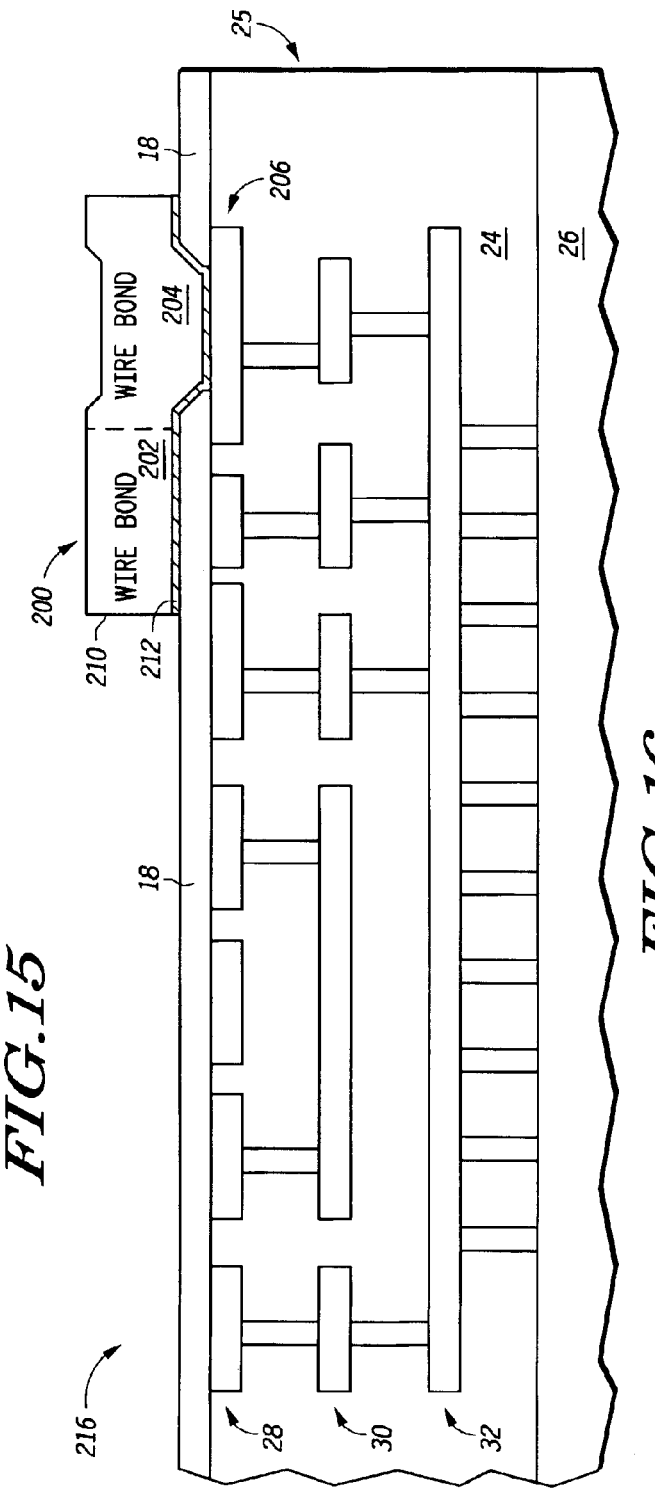
FIG. 16 illustrates a cross-sectional view of a semiconductor device having the bond pad of FIG. 15 in accordance with one embodiment of the present invention.

Bond pad 200 can be designed in different semiconductor devices, such as, for example, in semiconductor device 216 with a cross-sectional view illustrated in FIG. 16. As mentioned above, note that as used herein like or similar elements are given the same reference number throughout the figures. Also note the figures are not drawn to scale. FIG. 16 illustrates a cross-sectional view of a semiconductor device 216 (which may also be referred to as integrated circuit 216) in accordance with an alternate embodiment of the present invention. Semiconductor device 216 has an edge, or perimeter 25, passivation layer 18, interconnect region 24, and active region 26, and bond pad 200. Bond pad 200 includes aluminum pad 210 and final metal layer pad 206. Final metal layer pad 206 is formed as a portion of final metal layer 28. Therefore, in one embodiment, bond pad 200 may be formed from aluminum and the final metal layer pad 206 may be formed from copper. Bond pad 200 is positioned relative to the perimeter 25 of semiconductor device 216 and is separated into two wire bond regions as illustrated in FIG. 16 by a vertical dashed line. In the illustrated embodiment of FIG. 16, aluminum pad 210 is separated from the final metal layer pad 206 by a barrier layer 212 which provides a diffusion barrier and adhesion layer between final metal layer pad 206 and aluminum pad 210, and between aluminum pad 210 and passivation layer 18. However, note that in alternate embodiments, barrier layer 212 may not be present. For example, barrier layer 212 may not be needed if final metal layer pad 206 is formed from aluminum rather than copper. Also note that bond pad 200 may be formed of any wire bondable conductive material, such as, for example, aluminum, copper, and gold.

Semiconductor device 216 is subjected to fabrication techniques and materials as described in FIG. 4. As in FIG. 4, in the device of FIG. 16, one portion of the bond pad 200 extends over passivation layer 18 and underlying active circuitry 26 and/or interconnect region 24, and the remaining portion is connected to the final metal layer pad 206 at an opening in passivation layer 18. As described above, bond pad 200 is separated into wire bond region 202 and wire bond region 204. In the illustrated embodiment, wire bond region 204 is formed on the portion of bond pad 200 that is connected to the final metal layer pad 206 and wire bond region 202 is formed over passivation layer 18. That is, note that a portion of bond pad 200 extends over passivation layer 18. Therefore, in one embodiment, a non-periphery portion of either wire bond region 202 or wire bond region 204 or, alternatively, a majority of either wire bond region 202 or wire bond region 204 may be located over passivation layer 18. For example, in one embodiment, only a portion of wire bond region 204 may be formed on the portion of bond pad 200 that is connected to the final metal layer pad 206. In this embodiment, all of wire bond 202 and the remaining portion of wire bond 204 overlie passivation layer 18. Alternatively, all of wire bond 204 and a portion of wire bond 202 may be formed on the portion of bond pad 200 that is connected to the final metal layer pad 206. In this embodiment, only the remaining portion of wire bond 202 would overlie passivation layer 18. In yet another embodiment, passivation layer 18 may have multiple openings to expose final metal layer 28 where multiple portions of bond pad 200 (including portions of wire bond 204, portions of wire bond 202, or portions of both) may connect to final metal layer 28.

Note that the wire bond regions extending over passivation layer 18 are strong enough to withstand the impact of a wire bonding tool without damage or deformation to the underlying passivation layer 18 or circuits. Also note that although only two wire bond regions are illustrated in FIGS. 15 and 16, bond pad 200 can be formed to include any number of wire bond regions and is not limited to only two.

By extending bond pad 200 over passivation layer 18, the size of final metal layer pad 206 is not affected, and the size of bond pad 200 can be increased without increasing the overall size of the semiconductor device. The increased size of bond pad 200 allows for multiple wire bond connections to a single bond pad, which may be used in packaging multiple integrated circuit die together, as will be described in more detail below in reference to FIG. 21. Also, because final metal layer pad 206 is not used for wire bonding, the size and shape of final metal layer pad 206, and the size and shape of opening in passivation layer 18, are only constrained by the area needed to provide an electrical connection to bond pad 200. In other embodiments, there may be a plurality of smaller final metal layer pads and corresponding passivation openings that together provide sufficient electrical connection to bond pad 200. Since bond pad 200 is extended over passivation layer 18 and the size of final metal layer pad 206 is not affected, there is more flexibility in laying out wire bond regions. For an example, the wire bond regions may not necessarily be contiguous in other embodiments.

Figure 17:
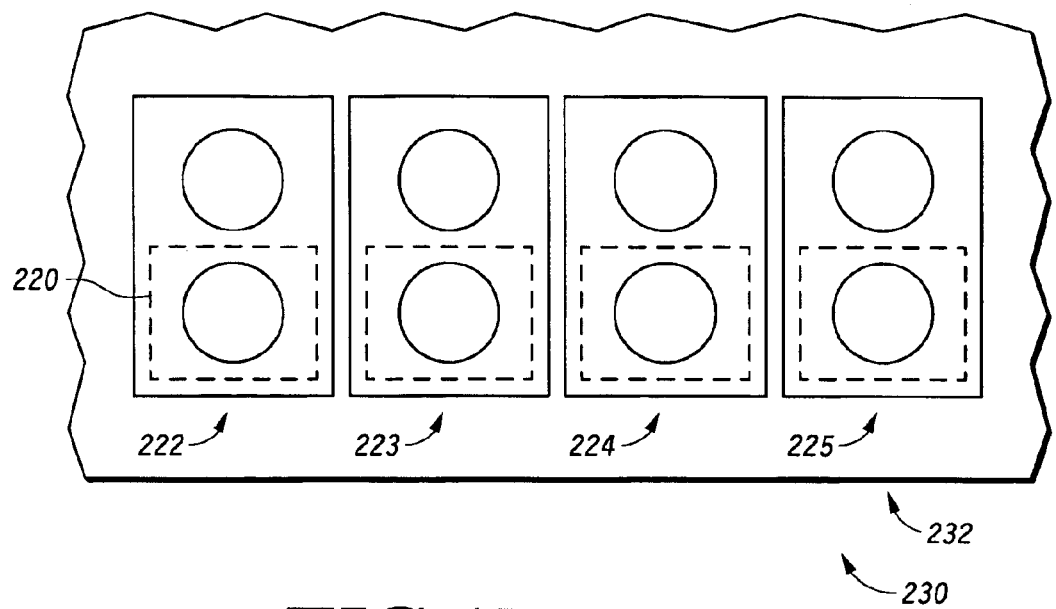
FIG. 17 illustrates a top down view of an integrated circuit having a plurality of wire bond pads in accordance with one embodiment of the present invention.

FIG. 17 illustrates a top down view of a semiconductor device 230 in accordance with another embodiment of the present invention. Integrated circuit 230 includes a plurality of bond pads similar to the bond pad illustrated in FIG. 15 and can be constructed in accordance with the embodiment illustrated in FIG. 16. Integrated circuit 230 includes a plurality of bond pads 222–225, formed along an edge 232 of the integrated circuit 230. The dashed line on each of the plurality of bond pads indicates an opening 220 formed in a passivation layer. Each of the bond pads is separated into multiple wire bond regions (i.e. two regions, in this example) as discussed in FIG. 15. The area on each bond pad bounded by a circle is the area designated generally for wire bonding. The plurality of bond pads are arranged relative to perimeter 232. In the illustrated embodiment, the bond pads are maintained in a line an equal distance from edge 232. In other embodiments, each of the plurality of bond pads may include more wire bond regions than just the two illustrated in FIG. 17.

A portion of the bond pads 222–225 is formed over the passivation layer, and a portion of the bond pads is formed over the final metal layer pad as illustrated in FIG. 16. Note that while opening 220 is illustrated as being beneath an entire one of the wire bond regions, opening 220 may be formed in a variety of ways as was discussed above in reference to FIG. 16. Also, opening 220 can be of any size or shape. For example, opening 220 may be as large as the entire bond pad 222, or may be smaller than illustrated. Opening 220 can also be of any shape, such as round, square, etc. Alternatively, opening 220 may include multiple openings (of any size or shape) beneath bond pad 222. Note also, that alternate embodiments may use alternate configurations for bond pads 222–225. For example, they may be staggered, sized, laid out, and positioned in a variety of different ways. For example, the configurations illustrated in FIGS. 7–14 may also be used for bond pads having multiple wire bond regions, even if no probe region is present. However, as will be described below, alternate embodiments may use the configurations of FIGS. 5–14 for bond pads having multiple wire bond regions and a probe region (or multiple probe regions).

Figure 18:
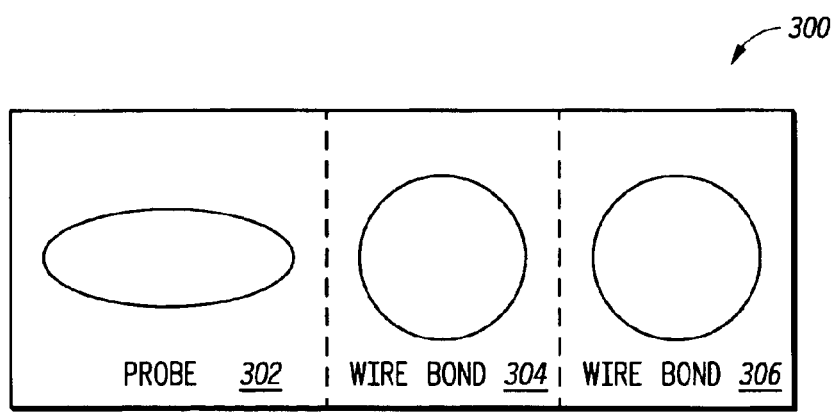
FIG. 18 illustrates a top down view of a wire bond pad in accordance with an alternate embodiment of the present invention.

FIG. 18 illustrates a top down view of a bond pad 300 in accordance with an alternate embodiment of the present invention. Bond pad 300 is separated into a probe region 302, a first wire bond region 304, and a second wire bond region 306, as indicated by the dashed lines. Wire bond regions 304 and 306 and probe region 302 are laid out and sized as needed to accommodate the size and accuracy of the wire bonding and probing tools. In the illustrated embodiment, wire bond region 304 is shown as being the same size as and adjacent to wire bond region 306. Also, in the illustrated embodiment, wire bond regions 304 and 306 are shown smaller than probe region 302. However, in alternate embodiments, the regions may be sized differently. Also, in alternate embodiments, probe region 302 may be located between wire bond region 304 and wire bond region 306 or may be located on the opposite side adjacent to wire bond 306 rather than adjacent to wire bond 304. In other embodiments, probe region 302 may be adjacent to both wire bond regions 304 and 306 or to only one of wire bond regions 304 and 306. That is, any ordering of wire bond and probe regions may be used to form bond pad 300. Also, although not illustrated, bond pad 300 may include any number of wire bond regions and any number of probe regions, as needed, and in any order.

Figure 19:
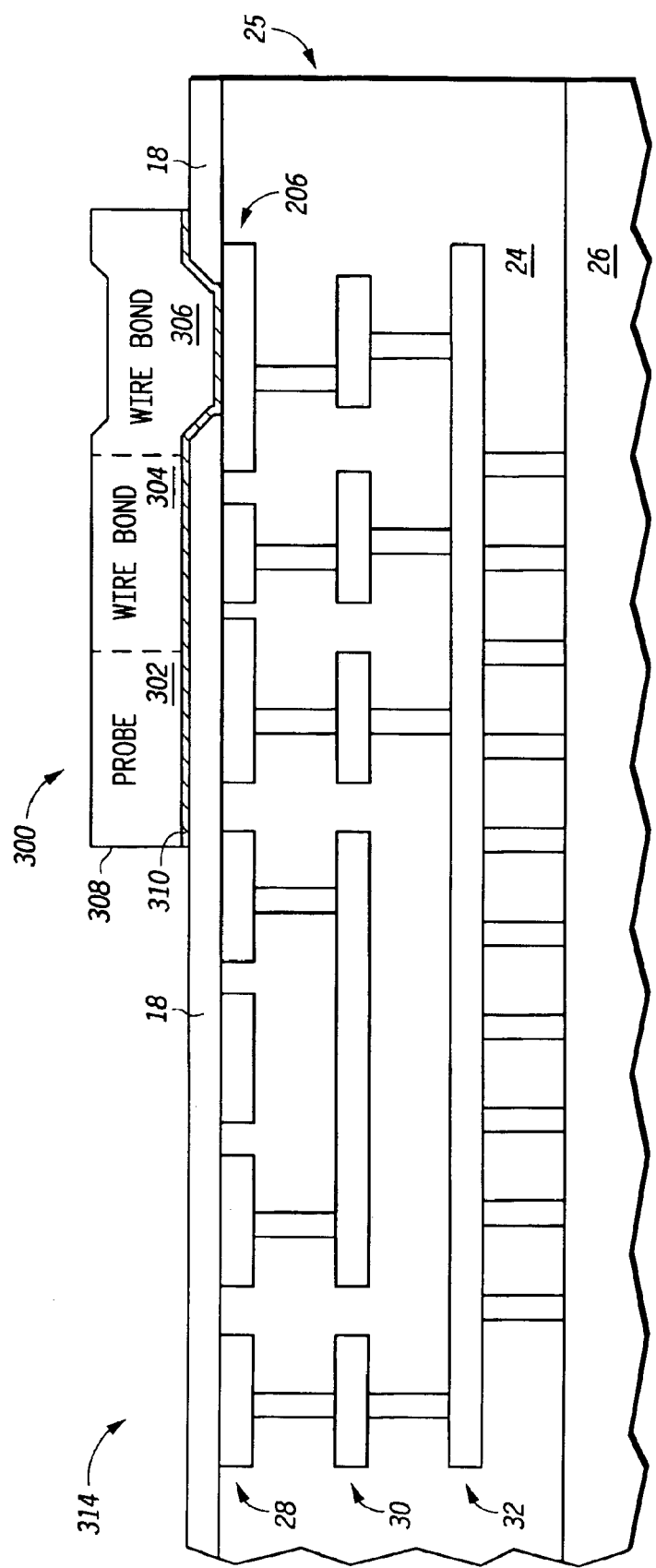
FIG. 19 illustrates a cross-sectional view of a semiconductor device having the bond pad of FIG. 18 in accordance with an alternate embodiment of the present invention.

Bond pad 300 can be designed in different semiconductor devices, such as, for example, in semiconductor device 314 with a cross-sectional view illustrated in FIG. 19. FIG. 19 illustrates a cross-sectional view of a semiconductor device 314 (which may also be referred to as integrated circuit 314) in accordance with an alternate embodiment of the present invention. Semiconductor device 314 has an edge, or perimeter 25, passivation layer 18, interconnect region 24, and active region 26, and bond pad 300. Bond pad 300 includes aluminum pad 308 and final metal layer pad 206. Final metal layer pad 206 is formed as a portion of final metal layer 28. Therefore, in one embodiment, bond pad 300 may be formed from aluminum and the final metal layer pad 206 may be formed from copper. Bond pad 300 is positioned relative to the perimeter 25 of semiconductor device 314 and is separated into two wire bond regions 304 and 306 and a probe region 302 as illustrated in FIG. 19 by the vertical dashed lines. In the illustrated embodiment of FIG. 19, aluminum pad 308 is separated from the final metal layer pad 206 by a barrier layer 310 which provides a diffusion barrier and adhesion layer between final metal layer pad 206 and aluminum pad 308, and between aluminum pad 308 and passivation layer 18. However, note that in alternate embodiments, barrier layer 310 may not be present. For example, barrier layer 310 may not be needed if final metal layer pad 206 is formed from aluminum rather than copper. Also note that bond pad 200 may be formed of any wire bondable conductive material, such as, for example, aluminum, copper, and gold.

Semiconductor device 314 is subjected to fabrication techniques and materials as described in FIG. 16. As in FIG. 16, in the device of FIG. 19, one portion of the bond pad 300 extends over passivation layer 18 and underlying active circuitry 26 and/or interconnect region 24, and the remaining portion is connected to the final metal layer pad 206 at an opening in passivation layer 18. As described above, bond pad 300 is separated into probe region 302, wire bond region 304, and wire bond region 306. In the illustrated embodiment, wire bond region 306 is formed on the portion of bond pad 300 that is connected to the final metal layer pad 206, and wire bond region 304 and probe region 302 are formed in the portion of bond pad 300 that extends onto passivation layer 18 (and over the electrical interconnect layers 28, 30, and 32 of interconnect region 24 and active region 26). That is, note that a portion of bond pad 300 extends over passivation layer 18. Therefore, in one embodiment, a non-periphery portion of either wire bond region 304, wire bond region 306, or probe region 302 or, alternatively, a majority of either wire bond region 304, wire bond region 306, or probe region 302 may be located over passivation layer 18. For example, in one embodiment, only a portion of wire bond region 306 may be formed on the portion of bond pad 300 that is connected to the final metal layer pad 206. In this embodiment, all of wire bond 304, probe region 302, and the remaining portion of wire bond 306 overlie passivation layer 18. Alternatively, any portion of wire bond regions 304 and 306 and probe region 302 may be formed in the portion of bond pad 300 that is connected to the final metal layer pad 206 where the remaining portions extend over passivation layer 18. In yet another embodiment, passivation layer 18 may have multiple openings to expose final metal layer 28 where multiple portions of bond pad 300 may connect to final metal layer 28.

Note that the wire bond regions 304 and 306 extending over passivation layer 18 are strong enough to withstand the impact of a wire bonding tool without damage or deformation to the underlying passivation layer 18 and circuits. Also note that when probe region 302 is formed over passivation layer 18, the impact of the probe tool does not damage passivation layer 18 either.

By extending bond pad 300 over passivation layer 18, the size of final metal layer pad 206 is not affected, and the size of bond pad 300 can be increased without increasing the overall size of the semiconductor device. The increased size of bond pad 300 allows for multiple wire bond connections to a single bond pad, which may be used in packaging multiple integrated circuit die together, as will be described in more detail below in reference to FIG. 21, while still allowing for probe testing. Also, because final metal layer pad 206 is not used for probe test or wire bonding, the size and shape of final metal layer pad 206, and the size and shape of opening in passivation layer 18, are only constrained by the area needed to provide an electrical connection to bond pad 300. In other embodiments, there may be a plurality of smaller final metal layer pads and corresponding passivation openings that together provide sufficient electrical connection to bond pad 300. Since bond pad 300 is extended over passivation layer 18 and the size of final metal layer pad 206 is not affected, there is more flexibility in laying out probe and wire bond regions. For an example, the probe and wire bond regions may not necessarily be contiguous in other embodiments.

In addition to having multiple wire bond regions for allowing multiple wire bond connections to a same bond pad, separating the probe region from the wire bond region or regions allows for more reliable wire bonds. Also, separation of the probe region from the wire bond region or regions allows for probing over the passivation layer 18 which eliminates the risk of inadvertently exposing the copper of the final metal layer pad 206. Exposed copper is readily oxidized and creates an unreliable surface for wire bonding.

Figure 20:
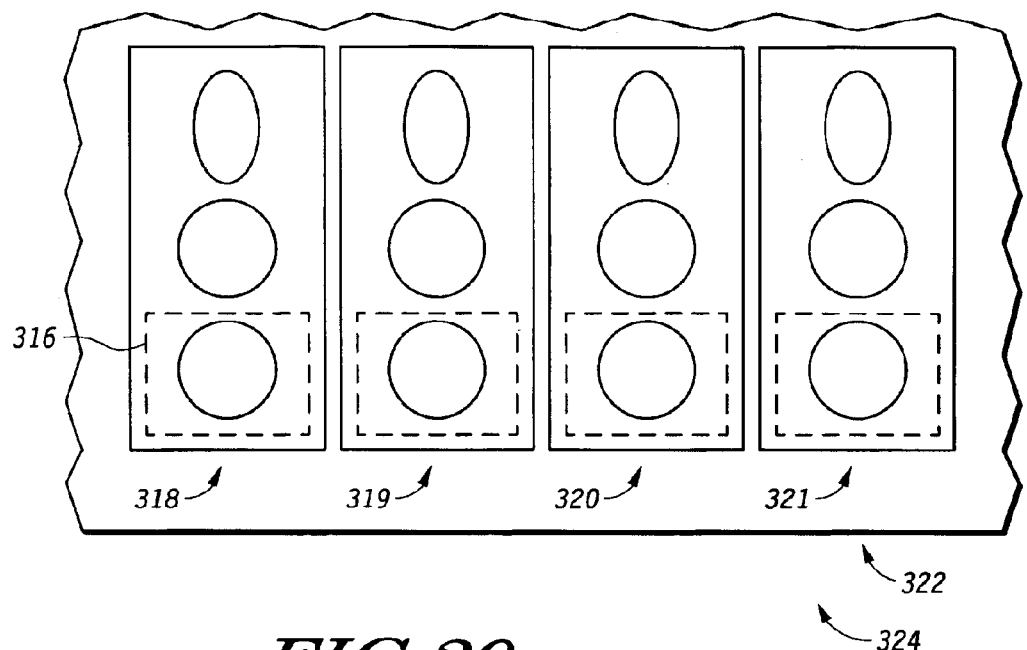
FIG. 20 illustrates a top down view of an integrated circuit having a plurality of wire bond pads in accordance with an alternate embodiment of the present invention.

FIG. 20 illustrates a top down view of a semiconductor device 324 in accordance with another embodiment of the present invention. Integrated circuit 324 includes a plurality of bond pads similar to bond pad 300 illustrated in FIG. 18 and can be constructed in accordance with the embodiment illustrated in FIG. 19. Integrated circuit 324 includes a plurality of bond pads 318–321, formed along an edge 322 of the integrated circuit 324. The dashed line on each of the plurality of bond pads indicates an opening 316 formed in a passivation layer. Each of the bond pads is separated into multiple wire bond regions (i.e. two regions, in this example) and a probe region, as discussed in FIG. 18. The area on each bond pad bounded by an oval is the area designated generally for probe testing, and the area on each bond pad bounded by a circle is the area designated generally for wire bonding. The plurality of bond pads is arranged relative to perimeter 322. In the illustrated embodiment, the wire bond regions are closer to perimeter 322 than the probe region of each bond pad, and the wire bond regions of adjacent bond pads are maintained in a line an equal distance from edge 322. Likewise, the probe regions of adjacent bond pads are maintained in a line an equal distance from edge 322. In other embodiments, each of the plurality of bond pads may include more wire bond regions than just the two illustrated in FIG. 20 and/or more probe regions. Also, as discussed in reference to FIG. 18, the probe regions and wire bond regions in each bond pad may be arranged in any order.

A portion of the bond pads 318–321 is formed over the passivation layer, and a portion of the bond pads is formed over the final metal layer pad as illustrated in FIG. 19. Note that while opening 316 is illustrated as being beneath an entire one of the wire bond regions, opening 316 may be formed in a variety of ways as was discussed above in reference to FIG. 19. Also, opening 316 can be of any size or shape. For example, opening 316 may be as large as the entire bond pad 318, or may be smaller than illustrated. Opening 316 can also be of any shape, such as round, square, etc. Alternatively, opening 316 may include multiple openings (of any size or shape) beneath bond pad 318. Note also that alternate embodiments may use alternate configurations for bond pads 318–321. For example, they may be staggered, sized, laid out, and positioned in a variety of different ways, as illustrated in FIGS. 7–14 above. For example, the configurations illustrated in FIGS. 7–14 may also be used for bond pads having multiple wire bond regions and one or more probe regions.

Figure 21:
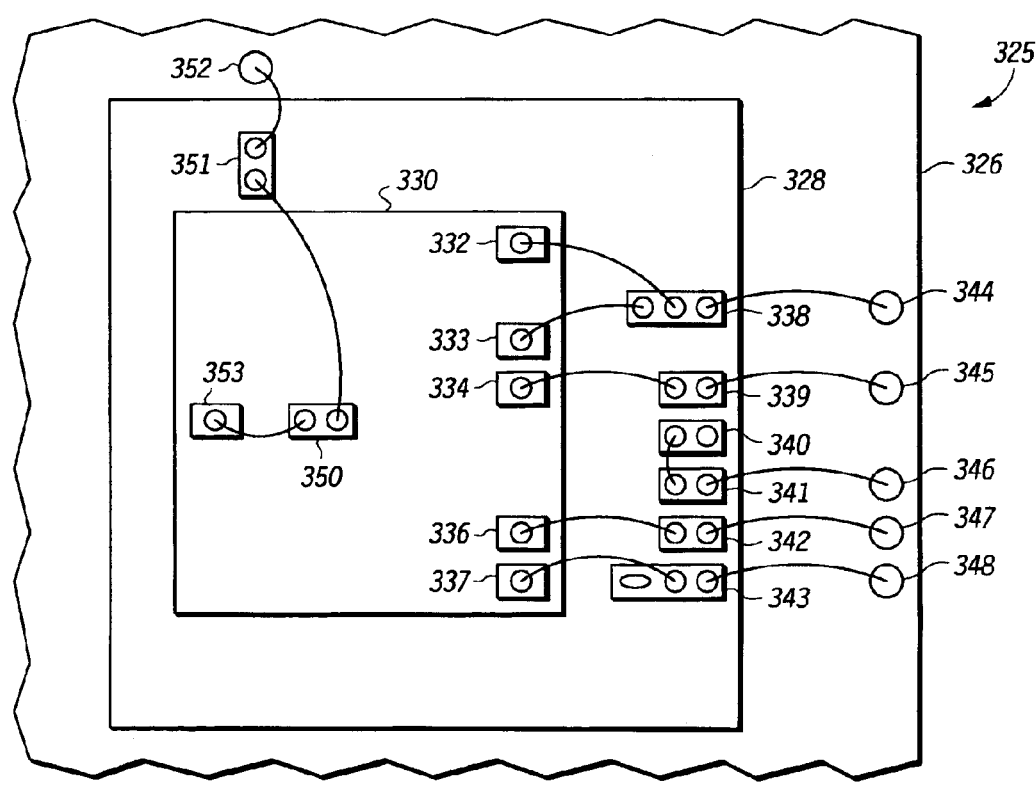
FIG. 21 illustrates a top down view of multiple integrated circuit die each having a plurality of wire bond pads in accordance with one embodiment of the present invention.

FIG. 21 illustrates a top down view of a multiple integrated circuit die configuration 325 using bond pads having multiple wire bond regions, in accordance with one embodiment of the present invention. Note that the drawing is not to scale, and not all bond pads have been shown. That is, only a portion of the bond pads is illustrated for ease of explanation, but one of ordinary skill in the art can appreciate how to complete the bond pad configuration. FIG. 21 illustrates a printed circuit board (PCB) 326 having a first integrated circuit die 328 and a second integrated circuit die 330 stacked upon first integrated circuit die 328. That is, FIG. 21 illustrates multiple integrated circuit die configured in a stacked multi-chip package. Integrated circuit die 330 includes bond pads 332–334, 336, 337 and 353 which are located along a perimeter of integrated circuit die 330 (i.e. in a periphery region of integrated circuit die 330) and a bond pad 350 which is located in a non-periphery region of integrated circuit die 330. In the illustrated embodiment, bonding pads 332–334, 336, 337 and 353 each has a single wire bond region, but in alternate embodiments, may have any number of wire bond regions and one or more probe regions, too. Integrated circuit die 328 includes bond pads 338–343 which are located along a perimeter of integrated circuit die 328 (i.e. in a periphery region of integrated circuit die 328) and bond pad 351 in a non-periphery region of integrated circuit die 328. In the illustrated embodiment, bond pads 338–343 each has multiple wire bond regions, and bond pad 343 has multiple wire bond regions and a probe region. However, in alternate embodiments, each bond pad may have any number of wire bond and probe regions. PCB 326 includes bond posts 344–348 and 352.

As illustrated in FIG. 21, bond pads with multiple wire bond regions may be used to provide multiple electrical connections to a single bond pad. For example, bond pad 350, located in a non-periphery region of integrated circuit 330, may be used to provide a connection (e.g. a wire connection) for both bond pad 353 on integrated circuit 330 and bond pad 351 on integrated circuit 328. For example, in one embodiment, bond pad 350 may correspond to power or ground which needs to be routed to another location on integrated circuit 330 and to a bond pad on integrated circuit 328. Bond pad 351, having two wire bond regions, may then have a second wire bond connection to bond post 352, such that a connection (e.g. wire connection) can be made from integrated circuit 330 to integrated circuit 328 to PCB 326 using only two bond pads. Similarly, bond pads 339 and 342 on integrated circuit 328 allow for electrical connections (e.g. wire connections) between bond pads 334 and 336 of integrated circuit 330, respectively, to PCB 326 (to bond posts 345 and 347) and connection between bond pads 339 and 342 to PCB 326 (to bond posts 345 and 347). Due to the use of bond pads with multiple wire bond regions, additional bond pads are not needed to allow for multiple die connections to PCB 326. Also note, although not shown, electrical connections can be made directly from integrated circuit die 330 to PCB 326. For example, one of the connections from bond pad 350 may be directly connected to bond post 352 rather than connected to bond post 352 via bond pad 351 on integrated circuit die 328.

Bond pad 343 illustrates an example of a bond pad having multiple wire bond regions in addition to a probe region. Bond pad 338 illustrates an example of a bond pad having multiple wire bond regions such that it may receive multiple wire bond connections from integrated circuit die 330 (from bond pads 332 and 333) and may provide a wire bond connection to PCB 326 (to bond post 344) using only a single bond pad. Additionally, bond pads with multiple wire bond regions may be used to provide electrical connections between bond pads of a same integrated circuit die. For example, bond pad 350 allows for a wire bond connection external to integrated circuit die 330 (to bond pad 351) and one internal to integrated circuit die 330 (to bond pad 353). Similarly, bond pad 341 allows for a wire bond connection external to integrated circuit die 328 (to bond post 346) and one internal to integrated circuit die 328 (to bond pad 340). Therefore, as can be seen, bond pads having multiple wire bond regions and, if desired, a probe region allows for greater flexibility in connecting multiple integrated circuit die while minimally impacting die size. Also, although not all possibilities are illustrated, bond pads having multiple wire bond regions, and if desired, one or more probe regions may be located on either integrated circuit die 330 or integrated circuit die 328.

In the illustrated embodiment, integrated circuit die 330 and integrated circuit die 328 are stacked integrated circuit die included within a same package. However, in alternate embodiments, integrated circuit die 330 may be adjacent to integrated circuit die 328, rather than stacked. That is, the bond pads described herein can be used for any multi-chip packages having any number of integrated circuit die in any configuration. Also, note that any number of integrated circuit die may be connected with each other using the bond pads and electrical connections described herein. In this embodiment, the illustrated bond pads described in reference to FIG. 21 may also be used to provide multiple wire bond connections while allowing for probe test (if a probe region is present on the bond pad).

Also, as illustrated in FIG. 21, integrated circuit die 328 is connected to PCB 326. However, in alternate embodiments, a lead frame, rather than a PCB, may be used where bond posts 344–348 and 352 would be located on a lead frame, as known in the art. Also, as known in the art, any type of wire bonding may be used to provide the connections described in reference to FIG. 21. For example, ball bonding, wedge bonding, ball bond on stud, etc. may be used. Furthermore, any type of material, as known in the art, may be used, such as, for example, gold, aluminum, copper, and insulated wire.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variations thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit comprising:
   a substrate;
   a layer of passivation over the substrate; and
   a bond pad over the substrate, the bond pad comprising:
      a first wire bond region for coupling a first wire bond to the integrated circuit; and
      a second wire bond region for coupling a second wire bond to die integrated circuit,
   wherein at least a non-periphery portion of the first wire bond region is located over the passivation, and wherein the layer of passivation underneath the bond pad has an opening, and where the opening is any shape; and
   wherein the substrate has an interconnect region, and wherein at least a portion of the interconnect region underlies a portion of the bond pad located over the passivation.

2. The integrated circuit of claim 1, wherein the substrate has active circuitry, and wherein at least a portion of the active circuitry underlies a portion of the bond pad located over the passivation.

3. The integrated circuit of claim 1, wherein a majority of the first wire bond region is located over the passivation.

4. The integrated circuit of claim 1, wherein none of the second wire bond region is located over the passivation.

5. The integrated circuit of claim 1, wherein at least a portion of the first wire bond region is located over the passivation, and at least a portion of the second wire bond region is located over the passivation.

6. The integrated circuit of claim 1, wherein the layer of passivation underneath the bond pad has a first opening and a second opening.

7. The integrated circuit of claim 1, wherein the first wire bond region and the second wire bond region are electrically connected.

8. An integrated circuit as in claim 1, wherein the bond pad is located in a periphery region of the integrated circuit.

9. An integrated circuit as in claim 1, wherein the bond pad is located in a non-periphery region of the integrated circuit.

10. An integrated circuit as in claim 1, wherein the integrated circuit is packaged in a multi-chip package, and wherein the multi-chip package comprises:
    a second integrated circuit comprising a second bond pad; and
    a wire for electrically coupling the first wire bond region and the second bond pad.

11. An integrated circuit comprising:
    a substrate;
    a layer of passivation over the substrate; and
    a bond pad over the substrate, the bond pad comprising:
       a first wire bond region for coupling a first wire bond to the integrated circuit,
       a second wire bond region for coupling a second wire bond to the integrated circuit, and
       a probe region for receiving a probe,
    wherein at least a non-periphery portion of the first wire bond region is located over the passivation.

12. An integrated circuit as in claim 11, wherein the probe region is adjacent to the first wire bond region and is not adjacent to the second wire bond region.

13. An integrated circuit as in claim 11, wherein the probe region is located between the first wire bond region and the second wire bond region.

14. An integrated circuit as in claim 11, wherein the first wire bond region is adjacent to the second wire bond region.

15. An integrated circuit as in claim 11, wherein the first wire bond comprises a first insulating wire and the second wire bond comprises a second insulating wire.

16. The integrated circuit of claim 11, wherein the substrate has active circuitry, and wherein at least a portion of the active circuitry underlies a portion of the bond pad located over the passivation.

17. The integrated circuit claim 11, wherein the layer of passivation underneath the bond pad has an opening, and where the opening is any shape.

18. A method for forming an integrated circuit comprising:
    providing a substrate;
    forming a layer of passivation over the substrate; and
    forming a bond pad over the substrate, wherein forming the bond pad comprises:
       forming a first wire bond region for coupling a first wire bond to the integrated circuit; and
       forming a second wire bond region for coupling a second wire bond to the integrated circuit,
    wherein at least a non-periphery portion of the first wire bond region is located over the passivation, and wherein the layer of passivation underneath the bond pad has an opening, and where the opening is any shape; and
    wherein the substrate has an interconnect region, and wherein at least a portion of the interconnect region underlies a portion of the bond pad located over the passivation.

19. A multi-chip package, comprising:
    a first integrated circuit, comprising:
       a substrate;
       a layer of passivation over the substrate; and
       a first bond pad over the substrate, the first bond pad comprising:
          a first wire bond region for coupling a first wire bond to the first integrated circuit; and a second wire bond region for coupling a second wire bond to the first integrated circuit,
wherein at least a non-periphery portion of the first wire bond region is located over the passivation;
a second integrated circuit, comprising:
a second bond pad; and
a first wire for electrically coupling the first wire bond region and the second bond pad.

20. The integrated circuit of claim 19, wherein the first integrated circuit and the second integrated circuit are stacked.

21. The integrated circuit of claim 19, wherein the first integrated circuit and the second integrated circuit are adjacent.

22. The integrated circuit of claim 19, wherein the first integrated circuit further comprises a third bond pad over the substrate, and wherein the multi-chip package further comprises a second wire for electrically coupling the second wire bond region and the third bond pad.

23. An integrated circuit comprising:
a substrate having active circuitry;
a layer of passivation over the substrate; and
a bond pad over the substrate, the bond pad comprising:
a first wire bond region for coupling a first wire bond to the integrated circuit; and
a second wire bond region for coupling a second wire bond to the integrated circuit,
wherein at least a non-periphery portion of the first wire bond region is located over the passivation, and wherein at least a portion of the active circuitry underlies a portion of the bond pad located over the passivation.

24. The integrated circuit of claim 23 wherein the substrate has an interconnect region, and wherein at least a portion of the interconnect region underlies a portion of the bond pad located over the passivation.

25. The integrated circuit of claim 23 wherein a majority of the first wire bond region is located over the passivation.

26. The integrated circuit of claim 23, wherein none of the second wire bond region is located over the passivation.

27. The integrated circuit of claim 23, wherein at least a portion of the first wire bond region is located over the passivation, and at least a portion of the second wire bond region is located over the passivation.

28. The integrated circuit of claim 23, wherein the layer of passivation underneath the bond pad has a first opening and a second opening.

29. The integrated circuit of claim 23, wherein the first wire bond region and the second wire bond region are electrically connected.

30. An integrated circuit as in claim 23, wherein the bond pad is located in a periphery region of the integrated circuit.

31. An integrated circuit as in claim 23, wherein the bond pad is located in a non-periphery region of the integrated circuit.

32. A method for forming an integrated circuit comprising:
providing a substrate having active circuitry;
forming a layer of passivation over the substrate; and
forming a bond pad over the substrate, wherein forming the bond pad comprises:
forming a first wire bond region for coupling a first wire bond to the integrated circuit; and
forming a second wire bond region for coupling a second wire bond to the integrated circuit,
wherein at least a non-periphery portion of the first wire bond region is located over the passivation, and wherein at least a portion of the active circuitry underlies a portion of the bond pad located over the passivation.

33. A method for forming an integrated circuit comprising:
providing a substrate;
forming a layer of passivation over the substrate; and
forming a bond pad over the substrate, wherein forming the bond pad comprises:
forming a first wire bond region for coupling a first wire bond to the integrated circuit;
forming a second wire bond region for coupling a second wire bond to the integrated circuit; and
a probe region for receiving a probe,
wherein at least a non-periphery portion of the first wire bond region is located over the passivation.

* * * * *

UNITED STATES PATENT AND TRADEMARK OFFICE
CERTIFICATE OF CORRECTION

| | | |
|---|---|---|
| PATENT NO. | : 6,921,979 B2 | |
| APPLICATION NO. | : 10/304416 | |
| DATED | : July 26, 2005 | |
| INVENTOR(S) | : Susan H. Downey et al. | |

It is certified that error appears in the above-identified patent and that said Letters Patent is hereby corrected as shown below:

Column 15, Line 42, Claim No. 1:

Change "die" to --the--

Signed and Sealed this

Twenty-sixth Day of December, 2006

JON W. DUDAS
*Director of the United States Patent and Trademark Office*